(12) United States Patent
Pai

(10) Patent No.: US 6,830,177 B2
(45) Date of Patent: Dec. 14, 2004

(54) METHOD AND APPARATUS TO COMPLIANTLY INTERCONNECT COMMERCIAL-OFF-THE-SHELF CHIP SCALE PACKAGES AND PRINTED WIRING BOARDS

(75) Inventor: Deepak K. Pai, Burnsville, MN (US)

(73) Assignee: General Dynamics Information Systems, Inc., Bloomington, MN (US)

( * ) Notice: Subject to any disclaimer, the term of this patent is extended or adjusted under 35 U.S.C. 154(b) by 0 days.

(21) Appl. No.: 10/238,118

(22) Filed: Sep. 10, 2002

(65) Prior Publication Data

US 2003/0049952 A1 Mar. 13, 2003

Related U.S. Application Data

(60) Provisional application No. 60/318,465, filed on Sep. 10, 2001, and provisional application No. 60/318,480, filed on Sep. 10, 2001.

(51) Int. Cl.[7] .............................................. B23K 31/02
(52) U.S. Cl. ........................... 228/180.21; 228/180.22; 228/234.2; 228/248.1
(58) Field of Search ........................... 228/179.1, 180.1, 228/180.21, 180.22, 215, 248.1, 234.2; 29/423, 830, 840, 843, 879, 884

(56) References Cited

U.S. PATENT DOCUMENTS

| | | | | |
|---|---|---|---|---|
| 4,616,406 A | * | 10/1986 | Brown | 29/588 |
| 4,827,611 A | | 5/1989 | Pai | 29/843 |
| 5,294,039 A | | 3/1994 | Pai | 228/180.22 |
| 5,317,479 A | | 5/1994 | Pai | 361/773 |
| 5,342,992 A | * | 8/1994 | Noto | 174/52.4 |
| 5,362,985 A | * | 11/1994 | Ma et al. | 257/707 |
| 5,455,390 A | | 10/1995 | DiStefano | 174/262 |
| 5,650,667 A | * | 7/1997 | Liou | 257/780 |
| 5,866,939 A | * | 2/1999 | Shin et al. | 257/666 |
| 6,000,126 A | | 12/1999 | Pai | 29/840 |
| 6,078,500 A | * | 6/2000 | Beaman et al. | 361/704 |
| 6,251,767 B1 | * | 6/2001 | Heinen | 438/616 |
| 6,344,684 B1 | * | 2/2002 | Hussain et al. | 257/697 |
| 6,378,758 B1 | * | 4/2002 | Haba | 228/180.1 |
| 6,493,238 B1 | * | 12/2002 | Pai | 361/772 |
| 2002/0125551 A1 | * | 9/2002 | Chiang | |
| 2003/0049952 A1 | * | 3/2003 | Pai | |

* cited by examiner

Primary Examiner—Kiley Stoner

(57) ABSTRACT

The present invention comprises cost-effectively manufactured, electrically conductive and mechanically compliant micro-leads and a method of utilizing these compliant micro-leads to interconnect area grid array chip scale packages ("CSPs") to printed wiring boards ("PWBs"). The preferred method includes orienting a plurality of conductive compliant micro-leads, secured to one another in parallel with tie bars and tooling, to align with a corresponding pattern of conductive pads located along the surface of an area grid array CSP. The compliant micro-leads are electrically connected and mechanically secured to the corresponding connecting surfaces of the area grid array CSP. Next, the securing tie bars and the tooling are removed. The opposite ends of the conductive compliant micro-leads are then oriented to align with a corresponding pattern of conductive surface pads on a PWB. The opposite end of each compliant micro-lead is then electrically connected and mechanically secured to its corresponding connecting pad located on the surface of the PWB, thereby establishing a compliant electrical connection between the area grid array CSP and the PWB. An alternative embodiment of the present invention utilizes an area grid array interposer with compliant micro-leads to provide additional compliancy.

11 Claims, 13 Drawing Sheets

METHOD AND APPARATUS TO COMPLIANTLY INTERCONNECT COMMERCIAL-OFF-THE-SHELF CHIP SCALE PACKAGES AND PRINTED WIRING BOARDS

CROSS REFERENCE TO RELATED APPLICATIONS

This application claims priority from U.S. Provisional Applications No. 60/318,465 and No. 60/318,480, both filed Sep. 10, 2001. The disclosures of both provisional applications are hereby incorporated by reference.

BACKGROUND OF THE INVENTION

1. Field of the Invention

The present invention relates to the mounting and connecting of devices and, in particular, to the mounting and connecting of microelectronic units such as chip scale packages ("CSPs") on printed wiring boards ("PWBs").

2. Description of the Prior Art

Early methods of mounting and connecting semiconductor chips to PWBs frequently resulted in unreliable connections. Specifically, the early methods provided an electrical connection between a semiconductor chip and a PWB that consisted of a solder joint. Though suitable for environments such as desktop use, such electrical connections proved unreliable in harsh environments that subject the board and chip to vibrations and temperature variations. The vibrations frequently caused fatigue failures in the solder joints. Temperature variations caused connection failures due to the difference in the thermal coefficients of expansion ("TCE") for the semiconductor chips and the PWB. A material's TCE is the rate at which the material expands or contracts in relation to changes in its temperature. PWBs, for example, frequently have a TCE that is higher than that of the semiconductor chips.

The differences in the TCEs for PWBs and semiconductor chips frequently caused solder joint strains on early chip mounted boards and often interrupted the electrical connections between the semiconductor chips and the PWB. To solve this problem, manufacturers developed improved methods of connecting semiconductor chips to PWBs. For example, manufacturers developed peripheral grid array ("PGA") chips configured to have leads arranged about the chip's periphery.

As shown in U.S. Pat. No. 4,827,611, No. 5,294,039, and No. 5,317,479, PGA chip design initially incorporated S-shape leads to compensate for the different TCEs for the PGA chip and the PWB. However, the drive to miniaturize semiconductor chip and PWB assemblies soon led to the development of C-shaped leads, because the S-shaped leads left too much space between the surface of the PWB and semiconductor chip. The C-shaped leads reduced the spacing between the surface of the chip and the PWB, and thus provided a mounted chip with a profile lower than a chip equipped with S-shaped leads. When used in external environments, which subjected the mounted assembly to vibration and wide temperature variations, the C-shape retained the lead's ability to compensate for the different TCEs of the chip and the PWB.

Prior to the advent of area grid array ("AGA") semiconductor chips, the C-shaped and the S-shaped leads proved adequate in dealing with the problem of differing TCEs for PGA semiconductor chips and PWBs. With AGA chips, however, the conductive connecting surface pads of the chip are arranged in a matrix array. Each connecting surface pad in the matrix is electrically coupled to a similar conductive pad located within a reciprocal corresponding matrix on the PWB. The means used to connect the AGA chip to the PWB typically consists of solder joints individually formed into a spherical shape. AGA chips, which employ the typical solder ball joints, are sometimes referred to as ball grid array ("BGA") chips. Prior art FIGS. 1 and 2 show the use of such a BGA.

FIG. 1 illustrates an AGA chip 50 having an array of conductive pads 95. FIG. 2 illustrates AGA chip 50 connected to a PWB 70 using solder balls 90, solder joints 55 formed between solder balls 90 and the conductive pads of AGA chip 50, and solder joints 77 formed between solder balls 90 and the corresponding conductive pads (not shown) of PWB 70. Solder balls 90 are typically made from conventional solder which, for example, may consist of 63 weight percent tin and 37 weight percent lead, or 10 weight percent tin and 90 weight percent lead, or an equivalent alloy. However, like the original semiconductor solders joints, solder ball joints are not very reliable when AGA chip 50 and PWB 70 are subjected to temperature variations and/or mechanical vibrations. Moreover, once AGA chip 50 is mounted on PWB 70, accessing a connection point between a single connection pad on AGA chip 50 and a reciprocal conductive pad on PWB 70 is difficult. When the solder ball joint fails, the entire AGA chip 50 must be removed from the PWB 70 in order to effect repairs. While AGA chips have reduced space required to connect the chips to the board, the reliability problems associated with solder joints between semiconductor chips and PWB have continued.

One attempted solution includes the use of solder columns instead of solder ball spheres. The solder columns are typically made of solder alloy having a composition of 10 weight percent tin and 90 weight percent lead. However, solder columns do not provide improved strength or reliability over solder balls. In addition, the high lead content of this solder alloy is highly undesirable because of heavy environmental pressure to avoid introducing additional lead into the environment.

Attempts have been made to use conductive leads to connect an AGA chip to a PWB. For example, U.S. Pat. No. 5,455,390 discloses a method of placing a plurality of conductive connecting leads between the conductive surface pads of the AGA chips and the corresponding connecting surface pads of the PWB. However, this method still results in connection failures because relatively unreliable materials, for example, gold, are used to make the conductive connecting leads.

U.S. Pat. No. 6,000,126 discloses an improved method of interconnecting an AGA chip to a printed wiring board. This method includes orienting a first side of a matrix of a plurality of conductive leads, secured relative to one another in parallel by an insulating carrier, so that the first ends of the leads are aligned with a corresponding matrix of conductive surface pads on an AGA chip. The leads are electrically connected to the corresponding conductive surfaces of the AGA chip. Next, the second side of the matrix of leads is oriented so that the second ends of the leads are aligned with a corresponding matrix of connecting surface pads on a PWB. The leads of the second side of the matrix are electrically connected to the corresponding conductive surface pads of the PWB, thereby establishing an electrical connection between the AGA chip and the PWB. While this method offers substantial advantages over the prior art, implementation remains relatively expensive, and the electronic assemblies that incorporate this method continue to experience interconnection reliability problems when subjected to harsh environmental conditions. In addition, this method is not applicable to modern plastic encapsulated microelectronic ("PEM") chip scale packages ("CSP") with fine-pitch (0.8 mm or less) AGA type interconnections involving miniature solder balls (0.5 mm or less) on miniature pads (0.3 mm or less).

SUMMARY OF THE INVENTION

The present invention comprises cost-effectively manufactured, electrically conductive and mechanically compliant micro-leads and a method of utilizing these compliant micro-leads to interconnect an area grid array CSP to a PWB. The preferred method includes orienting a plurality of conductive compliant micro-leads, secured to one another in parallel with tie bars and tooling, to align with a corresponding pattern of conductive pads located along the surface of an area grid array CSP. The compliant micro-leads are electrically connected and mechanically secured to the connecting surfaces of the area grid array CSP. Next, the securing tie bars and tooling are removed. The opposite ends of the conductive compliant micro-leads are then oriented to align with a corresponding pattern of conductive surface pads on a PWB. The opposite end of each compliant micro-lead is then electrically connected and mechanically secured to its corresponding connecting pad located on the surface of the PWB, thereby establishing a compliant electrical connection between the area grid array CSP and the PWB.

The compliant micro-leads of the present invention provide more mechanical compliancy than the solder balls or wire leads known in the art, and thus can better accommodate TCE mismatch between the area grid array CSP, solder joints and PWB. This capability enables electronic assemblies incorporating the compliant micro-leads and the method of the present invention to operate reliably over a wider temperature range. In a preferred embodiment, copper compliant micro-leads provide the additional thermal and electrical conductivity required by ever more robust components that consume ever-increasing amounts of power.

In addition to enhancing electrical and thermal conductivity in both favorable and unfavorable external environments, the conductive compliant micro-leads of the present invention offer a cost-effective method of replacing conductive solder balls of an area grid array CSP with lead-free, environmentally friendly metals. Compliant micro-leads thus provide an economically feasible way to advance the lead-free initiative advocated by many governments around the globe. Compared to lead solder balls of equal diameter, compliant micro-leads are also lighter in weight. The present invention contemplates the use of "lead-free" solder and can be easily applied to new area grid array CSP and plastic grid array (PGA). The compliant micro-leads may alternatively be attached by conductive adhesive or socket or compression fittings. An alternative embodiment of the present invention utilizes an area grid array interposer with compliant micro-leads to provide additional compliancy.

Thus, it is an object of the present invention to provide inexpensive and reliable electrical connections for area grid array CSP/PWB assemblies operating in harsh external environments. Another object of the present invention is to provide an electrical connection that exhibits improved thermal and electrical conductivity. Still another object of the present invention is to provide a lead-free alternative way to electrically interconnect area grid array CSP to PWB. It is a further object of the present invention to reduce the electrical interconnection's contribution to overall weight of an electronic assembly.

Other features, objects and advantages of the invention will become apparent from the following description and drawings, in which the details of the invention are fully and completely disclosed as a part of this specification.

DETAILED DESCRIPTION OF THE ILLUSTRATED EMBODIMENT

Figure 1:
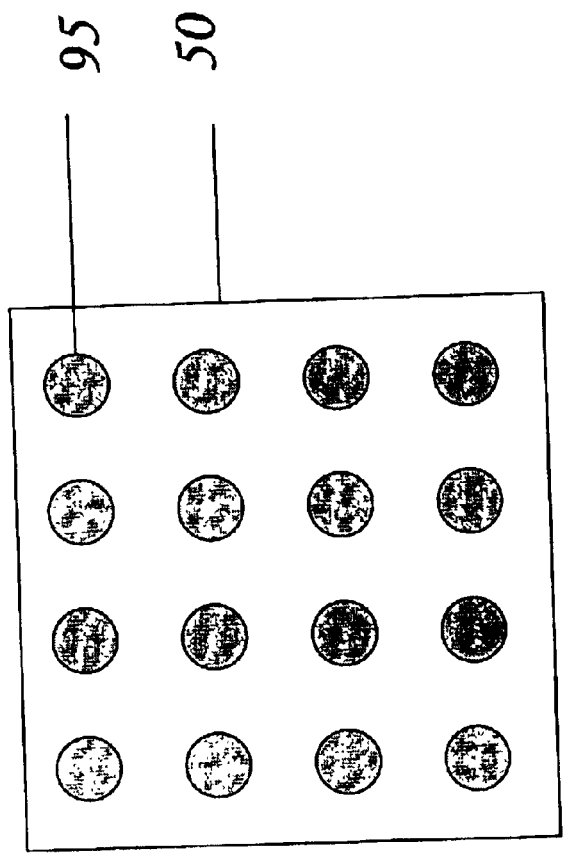
FIGS. 1 and 2 show prior art AGA chips using solder ball joints.
Figure 2:
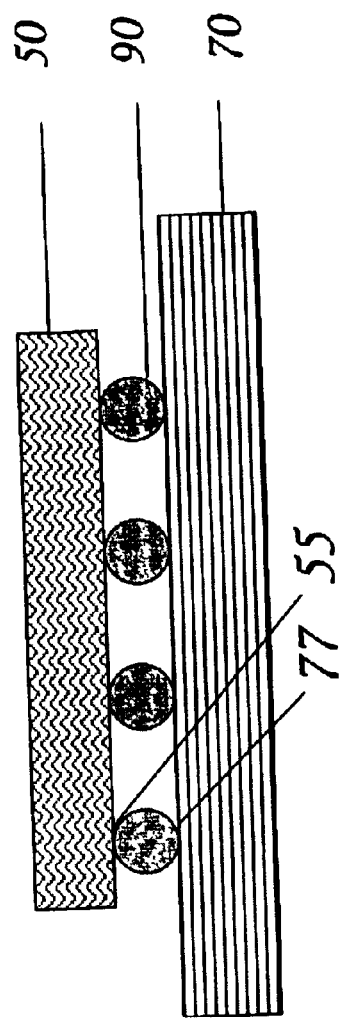
Figures 3A, 3B:
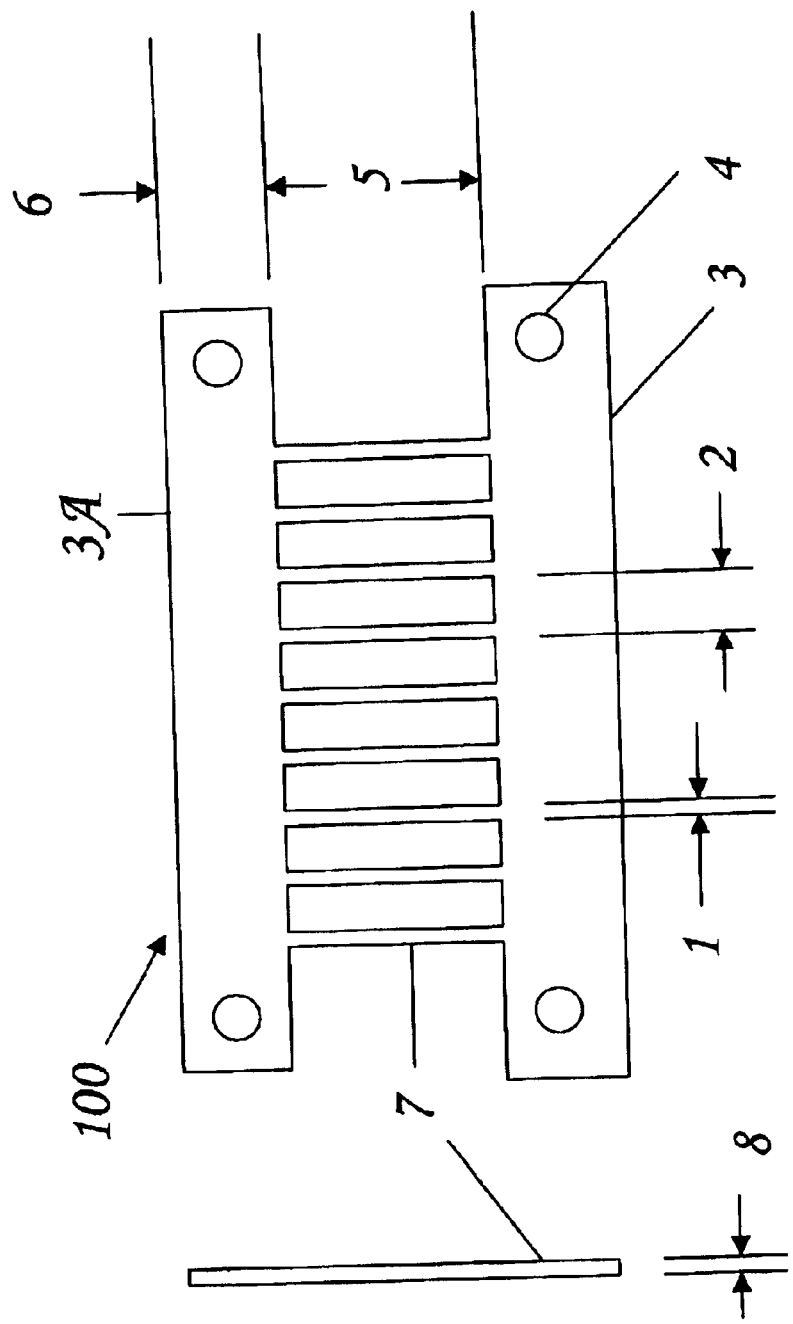
FIGS. 3a and 3b show the compliant micro-lead frame of the present invention.
Figure 4:
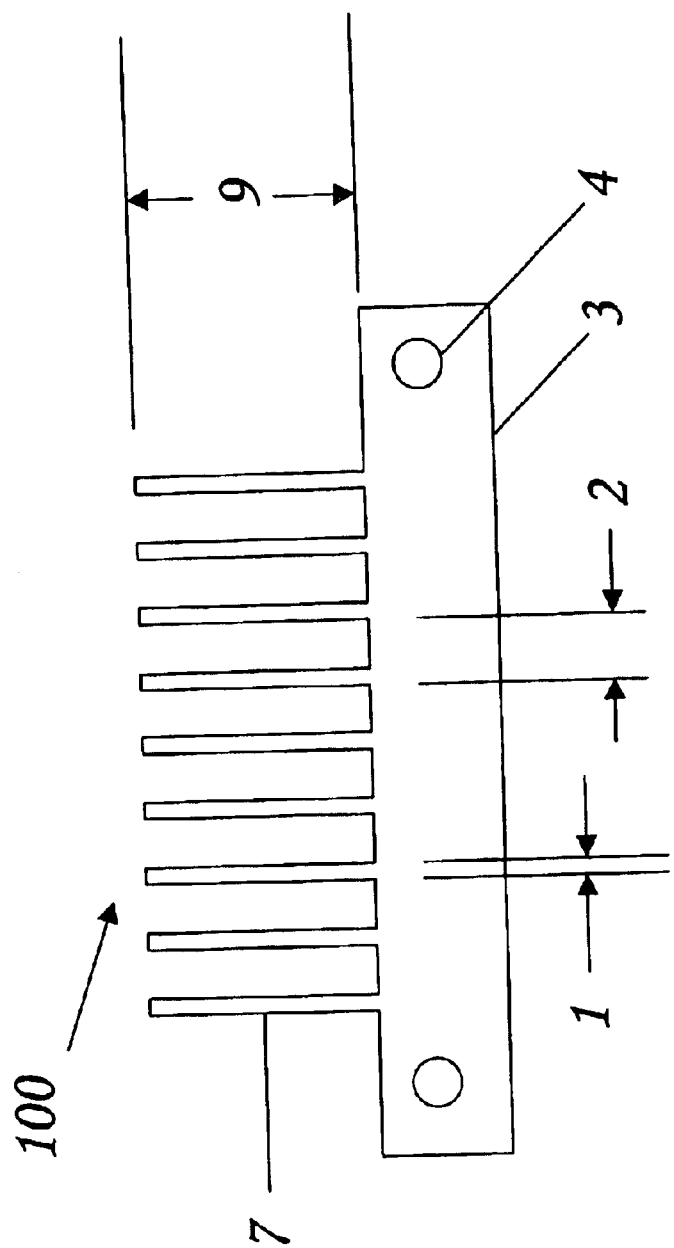
FIG. 4 shows the compliant micro-lead frame after removing the tie bar on one end.

Compliant micro-lead frame 100 of the present invention is illustrated in FIGS. 3a through 4. The micro-lead frame 100 includes tie-bars 3 and 3A with alignment holes 4 in addition to compliant micro-leads 7.

Compliant micro-leads 7 are made from an electrically conductive, flexible material such as copper. Compliant micro-leads 7 are preferably formed in a square shape and are preferably plated with tin, lead-free alloy, tin:lead alloy, or nickel:silver alloy. Compliant micro-leads 7 preferably have a length 5 between 2.0 and 2.5 millimeters, with 2.0 millimeters being the preferred length. Compliant micro-leads 7 preferably have a thickness 8 and width 1 of about 0.127 millimeter.

Compliant micro-lead frame 100 is preferably fabricated from a 0.127 millimeter thick copper sheet using typical printing, etching and plating processes known in the art and available in most PWB fabrication shops. The design illustrated in FIG. 3a is unique to the present invention.

FIG. 4 illustrates compliant micro-lead frame 100 after removing tie-bar 3A. After removing tie-bar 3A, compliant micro-leads 7 preferably have a length 9 between 0.75 to 0.85 millimeter, with 0.75 millimeter being the preferred length.

Figure 5:
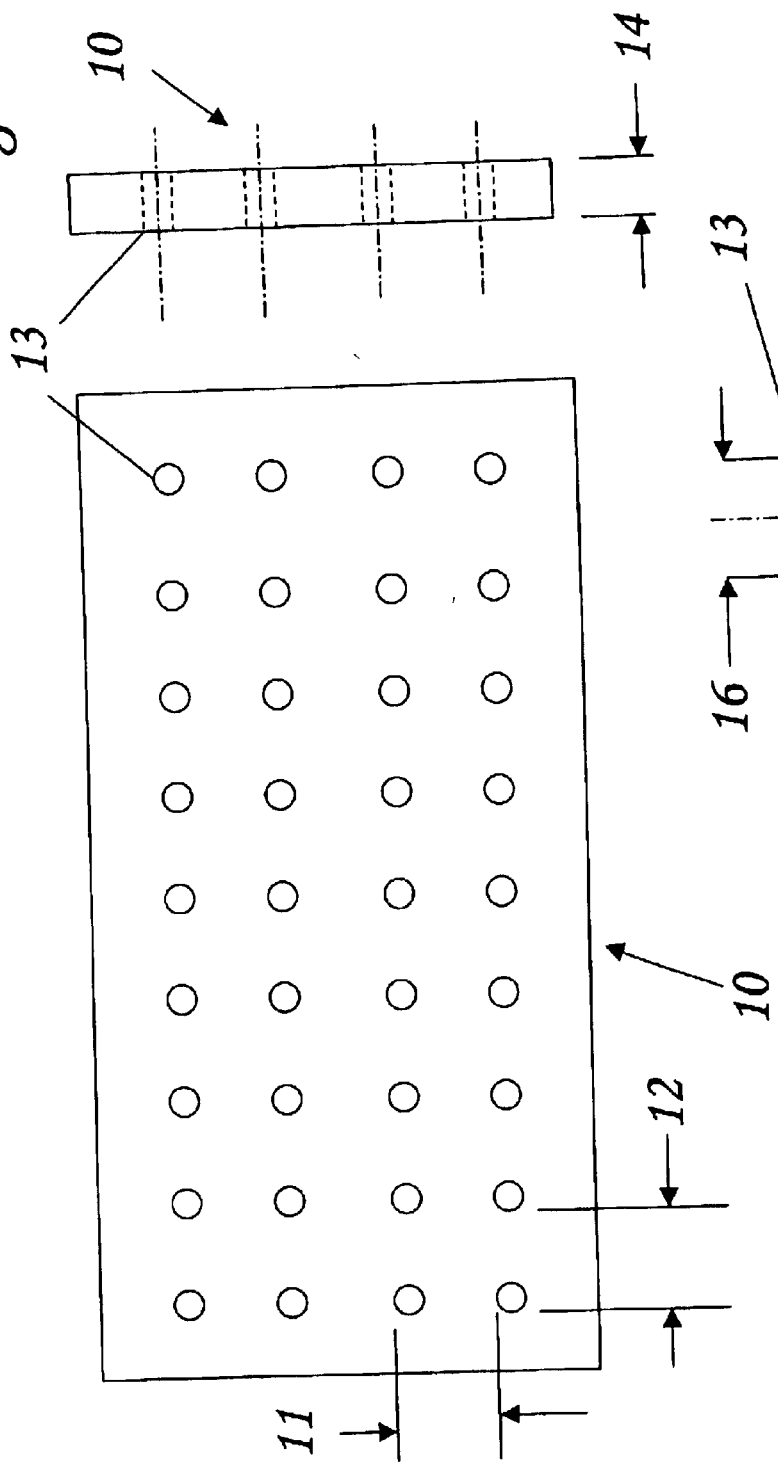
FIGS. 5a–c show the compliant micro-lead attachment tool.

Compliant micro-lead frame attachment tool 10 of the present invention is illustrated in FIGS. 5a–5c. Precision drilling creates a matrix of holes 13 in attachment tool 10. The X-pitch 12 and Y-pitch 11 precisely match the X-pitch and Y-pitch of the area grid array CSP component interconnect matrix (not shown). Hole 13 is preferably chamfered at 45 degrees near the area grid array CSP attachment side as shown in the cross section view illustrated in FIG. 5b. As illustrated in FIG. 5c, attachment tool 10 preferably has a thickness 14 between 0.75 and 0.85 millimeter, with 0.75 millimeter being the preferred thickness. As FIG. 5b shows, holes 13 preferably have a diameter 17 of about 0.2 to 0.22 millimeter at the tie-bar attachment side and a diameter 16 of 0.30 to 0.32 millimeter at the area grid array CSP mounting side.

Attachment tool 10 is preferably made of stainless steel, aluminum, or titanium alloys, because they do not adhere to most solder alloys. Other materials having this property may be used as well. Stainless steel alloy 302 is preferred.

Figure 6:
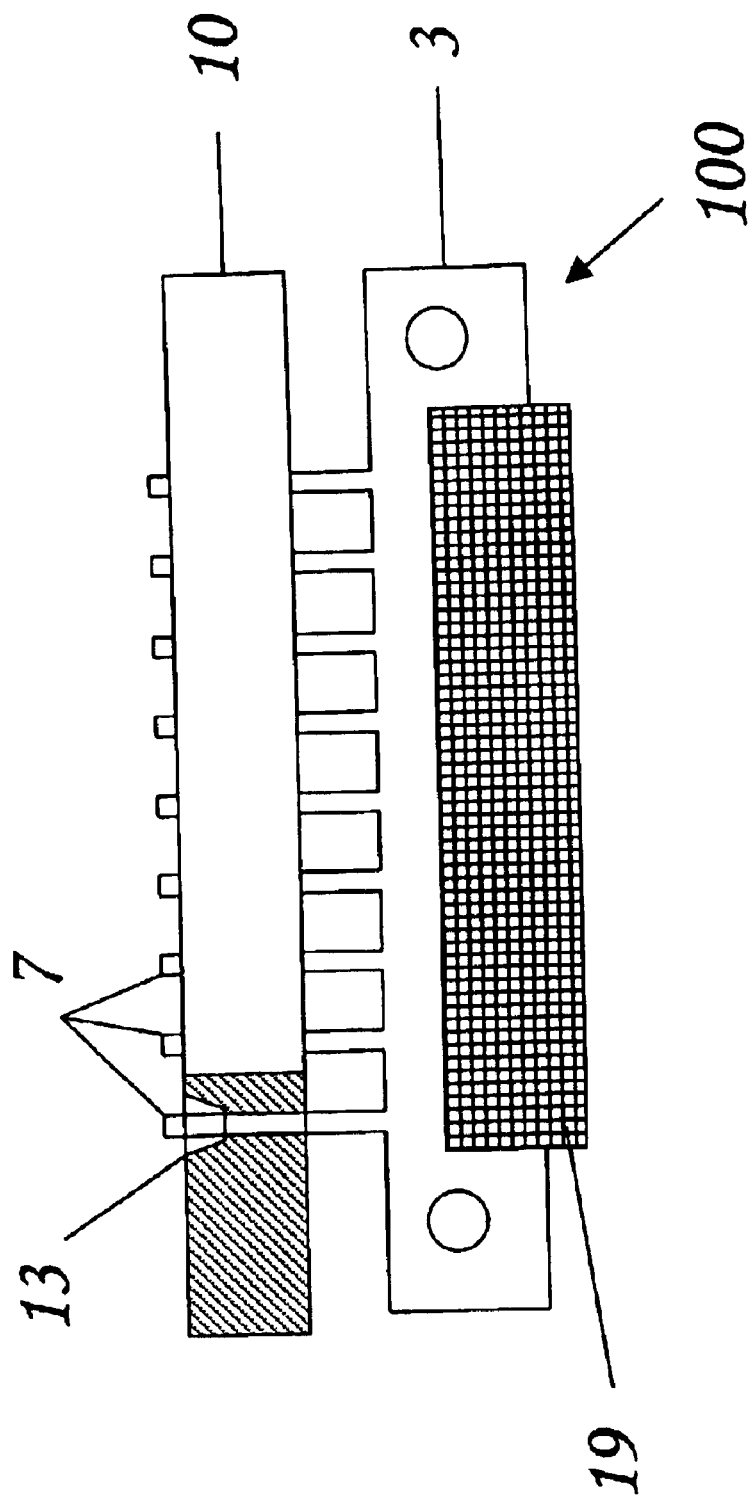
FIG. 6 shows a plurality of compliant micro-leads placed in the attachment tool and a comb frame for securing tie bars of the micro-lead frames prior to assembly.
Figure 7:
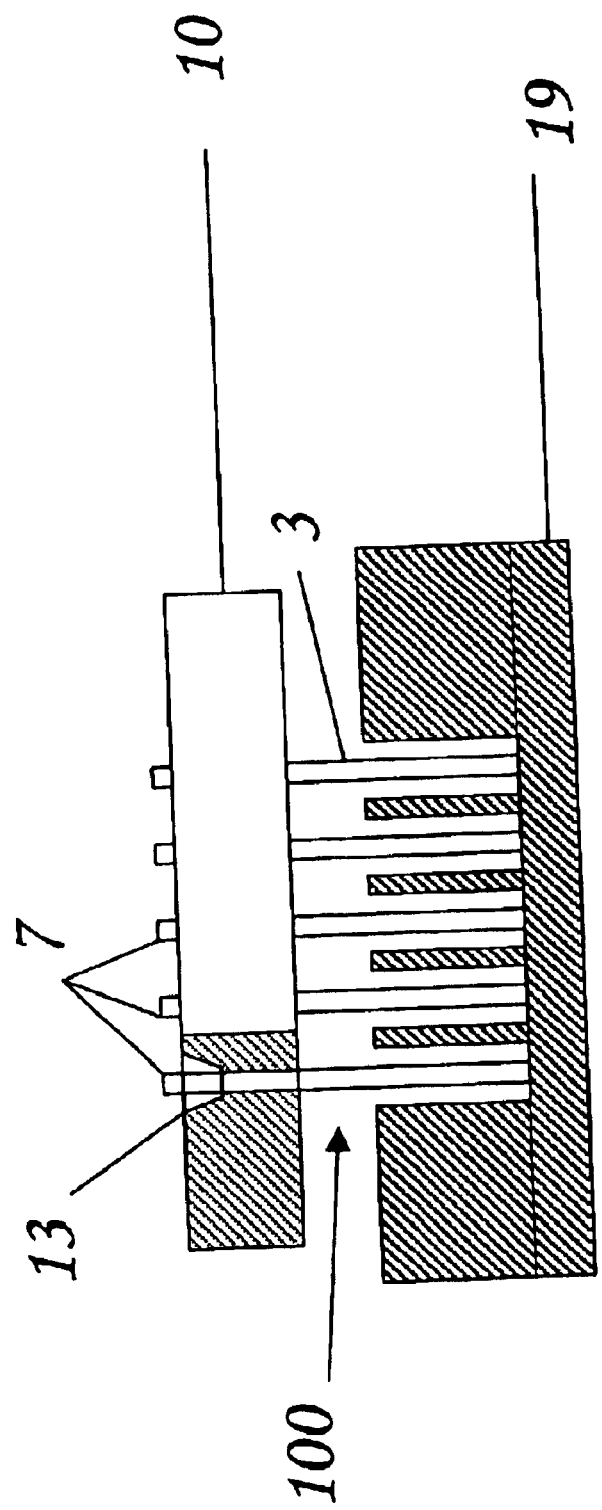
FIG. 7 shows a plurality of micro-lead frames, whose compliant leads are placed in the attachment tool, placed in a comb frame.

As shown in FIGS. 6 and 7, comb frame 19 is used to support the tie-bars 3 of a plurality of micro-lead frames 100. The compliant micro-leads 7 of the plurality of micro-lead frames 100 are mounted in corresponding holes 13 of attachment tool 10 prior to the soldering operation.

Figure 8:
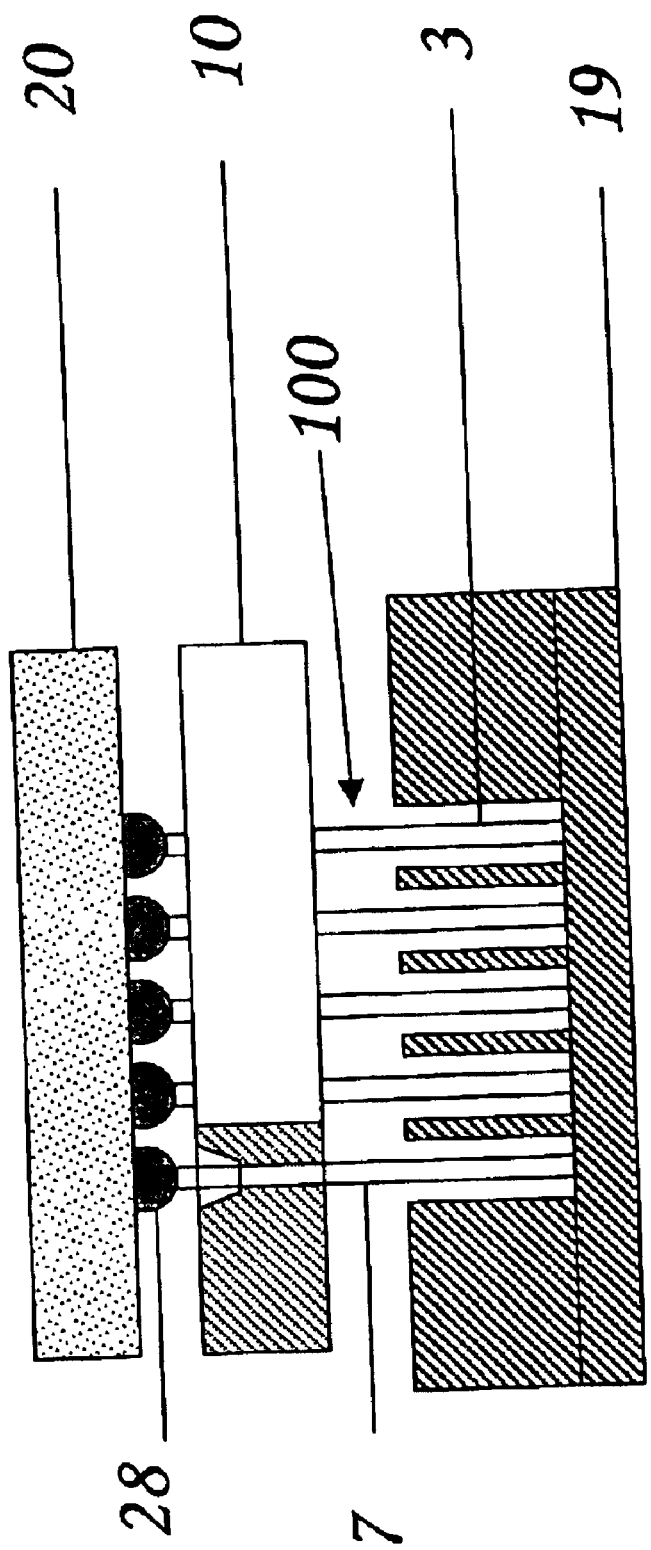
FIG. 8 shows the solder attachment of area grid array CSP to the compliant micro-leads secured in the attachment tool.

FIG. 8 illustrates the solder attachment of area grid array CSP 20 to compliant micro-leads 7 secured in attachment tool 10. The following method is used to interconnect area grid array CSP 20 to micro-leads 7. First, existing solder balls on the area grid array CSP 20 are removed from the interconnect pads by "wicking" or similar processes commonly practiced in most electronic assembly shops. The pads are cleaned thoroughly to remove contaminants and flux residues. A calculated amount of solder paste, made of a specified alloy as required to form a quality solder joint, is deposited on the area grid array CSP interconnect pads by overlaying a stencil (not shown) with a matrix of holes onto the area grid array CSP 20 prior to applying the solder paste. The holes of the stencil correspond to the connecting surface pads of the area grid array CSP. Area grid array CSP 20 is then mounted onto compliant micro-leads 7 as shown in FIG. 8. The area grid array CSP pads are soldered to the compliant micro-leads 7 at solder joints 28 using "convection or vapor-phase" soldering processes commonly used in most assembly shops.

Figure 9:
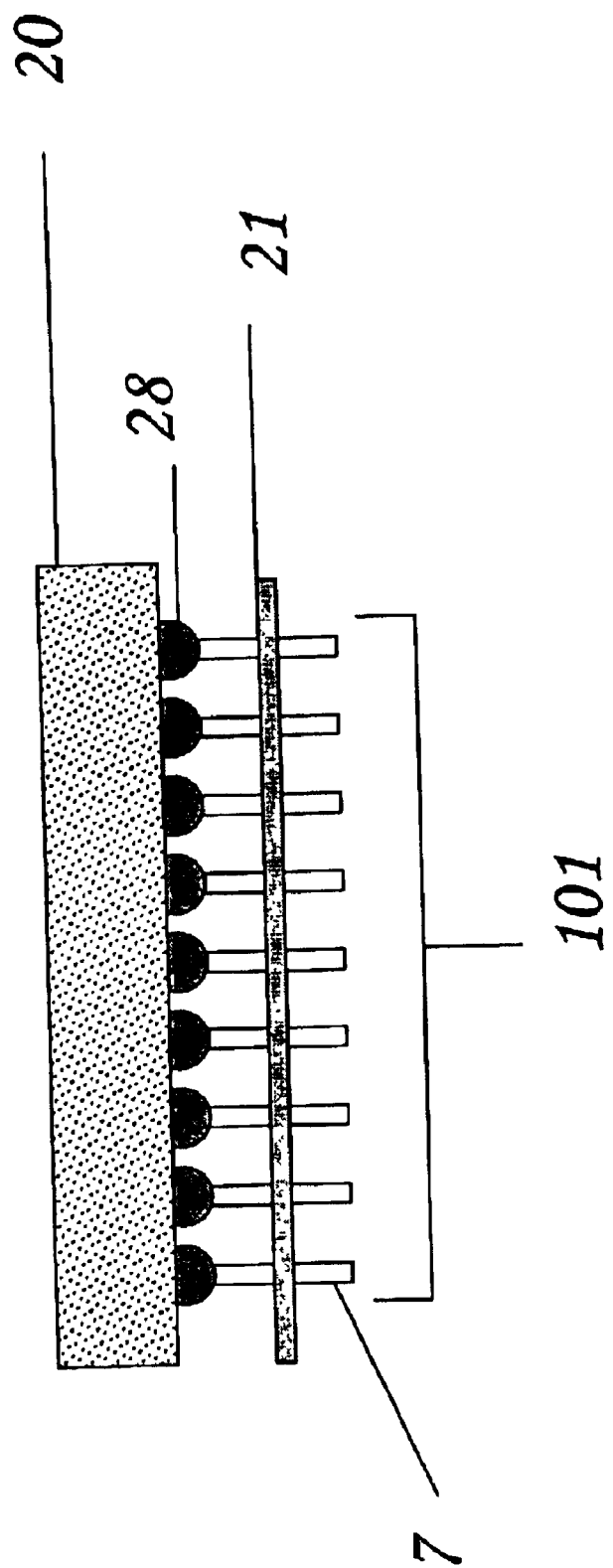
FIG. 9 shows a compliant micro-lead matrix soldered to an area grid array CSP assembly after removing the tie-bars and attachment tool.

FIG. 9 illustrates area grid array CSP 20 assembled to compliant micro-lead matrix 101. Micro-lead matrix 101 consists of the plurality of micro-leads 7 remaining after tie-bars 3 and attachment tool 10 are removed from the plurality of micro-lead frames 100. This assembly is now ready for attachment to PWB 30. Spacer 21 is optional. Spacer 21 preferably is made from a 0.05 millimeter thick polyimide film with holes. The holes in spacer 21 are aligned with micro-leads 7 and preferably have a diameter of 0.20 to 0.22 millimeter. The polyimide film materials are well known to those skilled in the art and are available from sources such as DuPont (Del.) and Rogers (Colo.).

Figure 10:
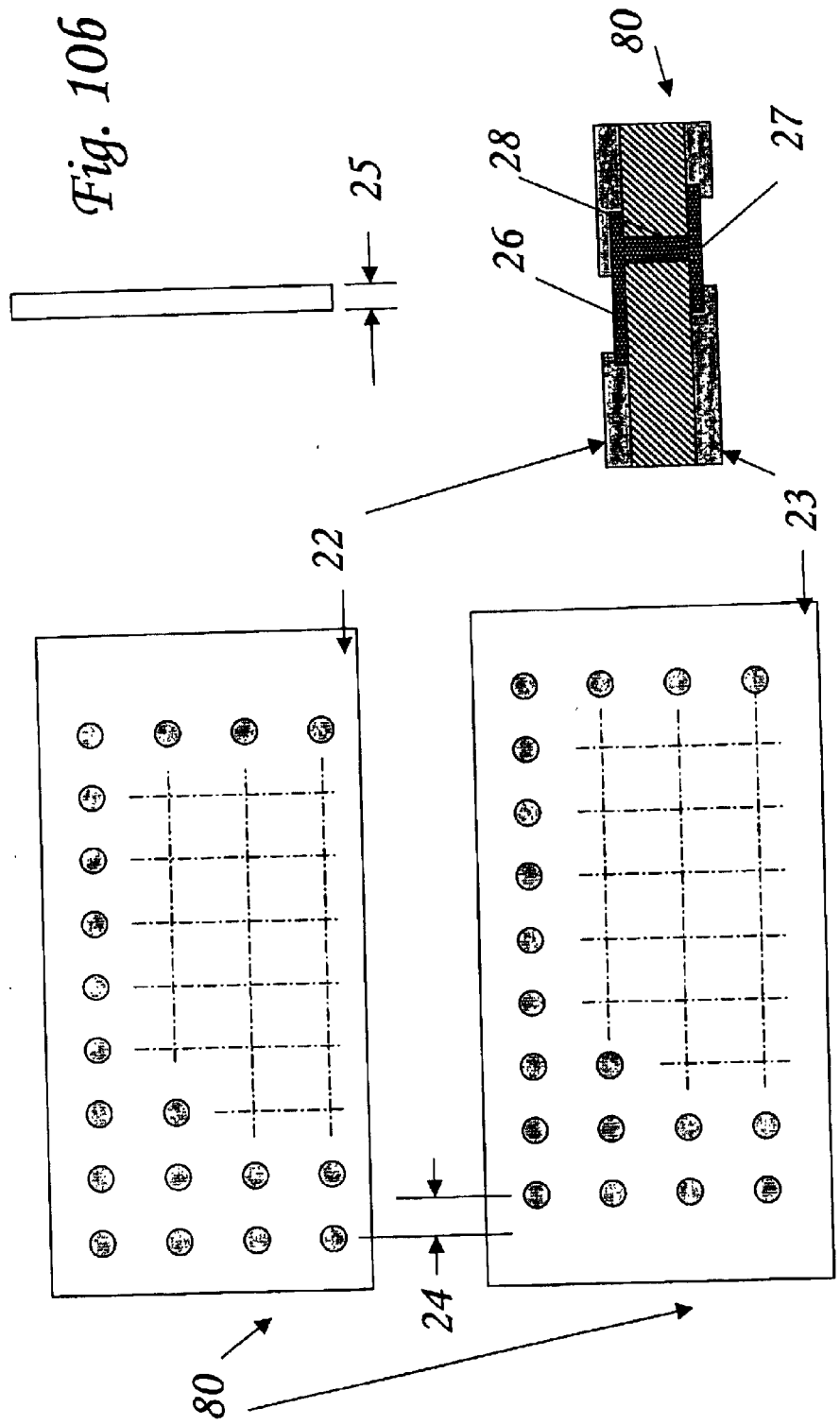
FIGS. 10a–c show the area grid array interposer of the present invention.

FIGS. 10a–10c illustrate an alternative embodiment of the present invention. Area grid array interposer 80 can be used with compliant micro-lead matrix 101 to provide additional compliancy. Interposer 80 is preferably made from any one of the following materials commonly used in most PWB fabrication shops: FR4, High temperature FR4, BT or polyimide. These materials are well known to those skilled in the art and are available from sources such as DuPont (Del.), Nelco (Calif.), Hitachi (Japan). Pad matrices on surfaces 22 and 23, of the CSP side and the PWB side respectively, match with CSP and PWB pads, and are offset by distance 24 to enhance compliancy. Interposer 80 preferably has a thickness 25 of about 0.254 millimeter. Pad 26 on surface 22 is connected to pad 27 on surface 23 via solder joint 28. Pads 26 and 27 are preferably coated with tin, electroless nickel and immersion gold or lead-free solder alloys using processes commonly practiced in most PWB fabrication shops.

Figure 11:
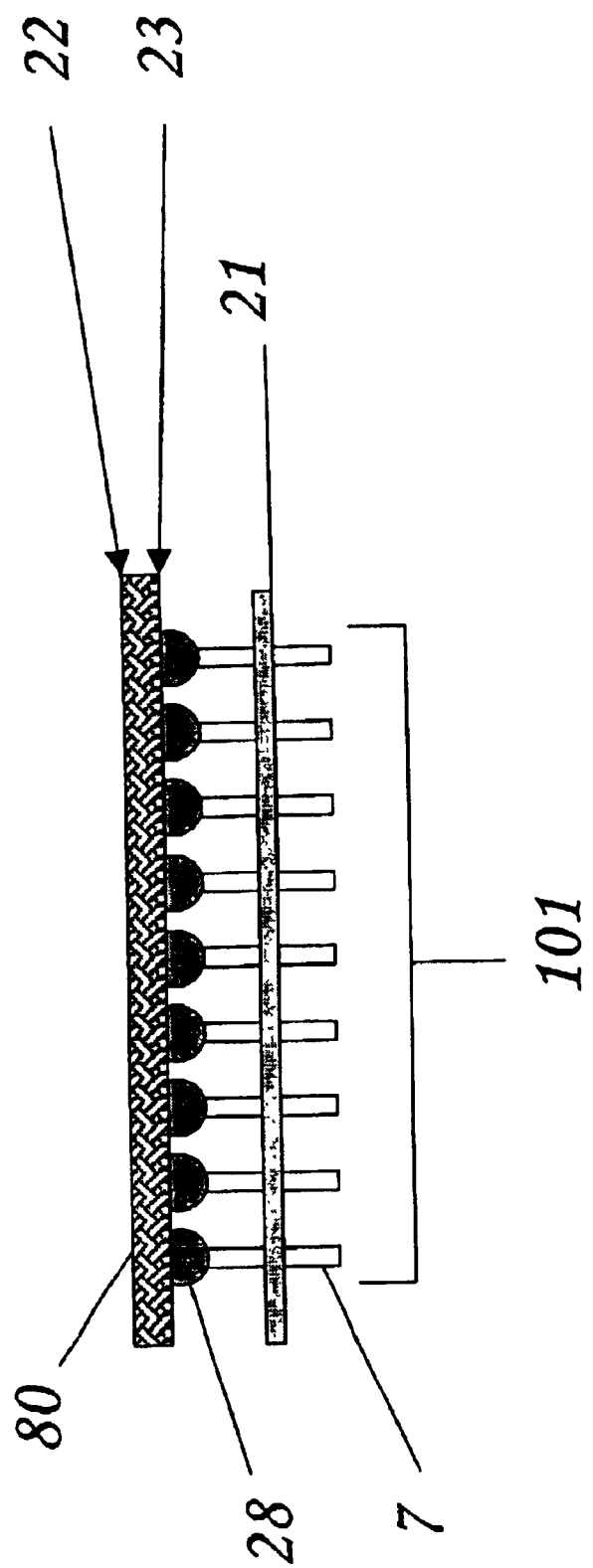
FIG. 11 shows the assembly of the interposer to compliant micro-lead matrix.

FIG. 11 illustrates the assembly of area grid array interposer 80 to compliant micro-leads 7 of compliant micro-lead matrix 101 at solder joints 28. The process is the same as the process used for assembly of area grid array CSP 20 to compliant micro-lead matrix 101. Spacer 21 is shown installed, but it is optional.

Figure 12:
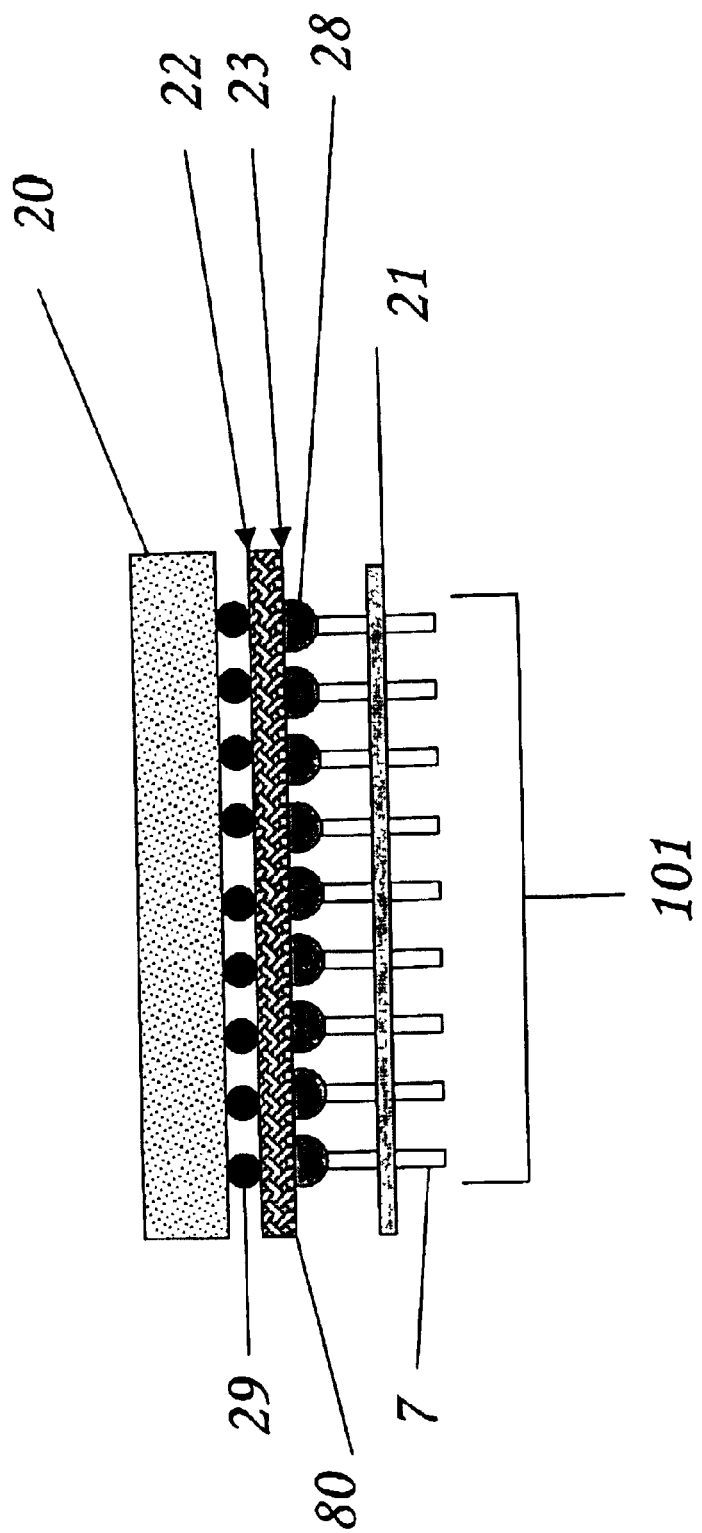
FIG. 12 shows the assembly of an area grid array CSP to the compliant micro-lead matrix and interposer assembly from FIG. 11.

FIG. 12 illustrates assembly of area grid array CSP 20 to area grid array interposer 80 with compliant micro-lead matrix 101 using solder balls 29 of the area grid array CSP 20. This task is accomplished using surface mount assembly techniques known in the art and common to most assembly shops. Again, spacer 21 is shown but optional.

Figure 13:
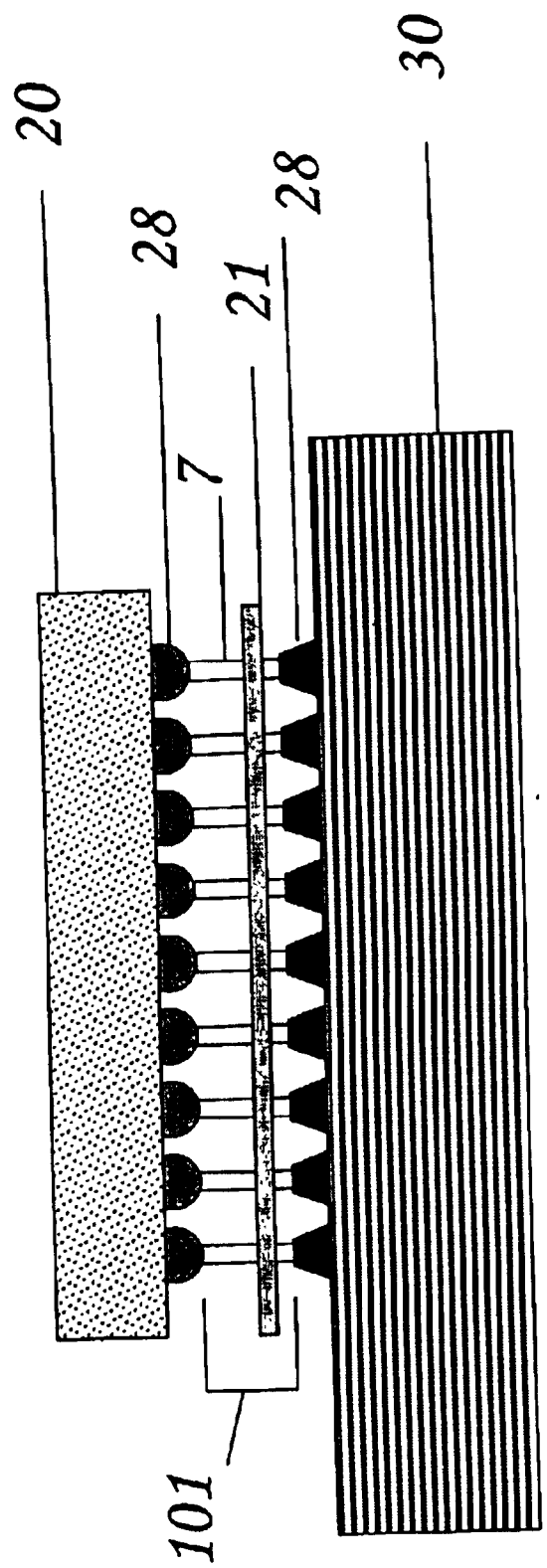
FIG. 13 shows the assembly of the PWB to the area grid array CSP with the compliant micro-lead matrix.

FIG. 13 illustrates assembly of area grid array CSP 20 with compliant micro-lead matrix 101 to PWB 30 at solder joints 28. This task is accomplished using surface mount assembly techniques known in the art and common to most assembly shops. Spacer 21 is shown but optional.

Figure 14:
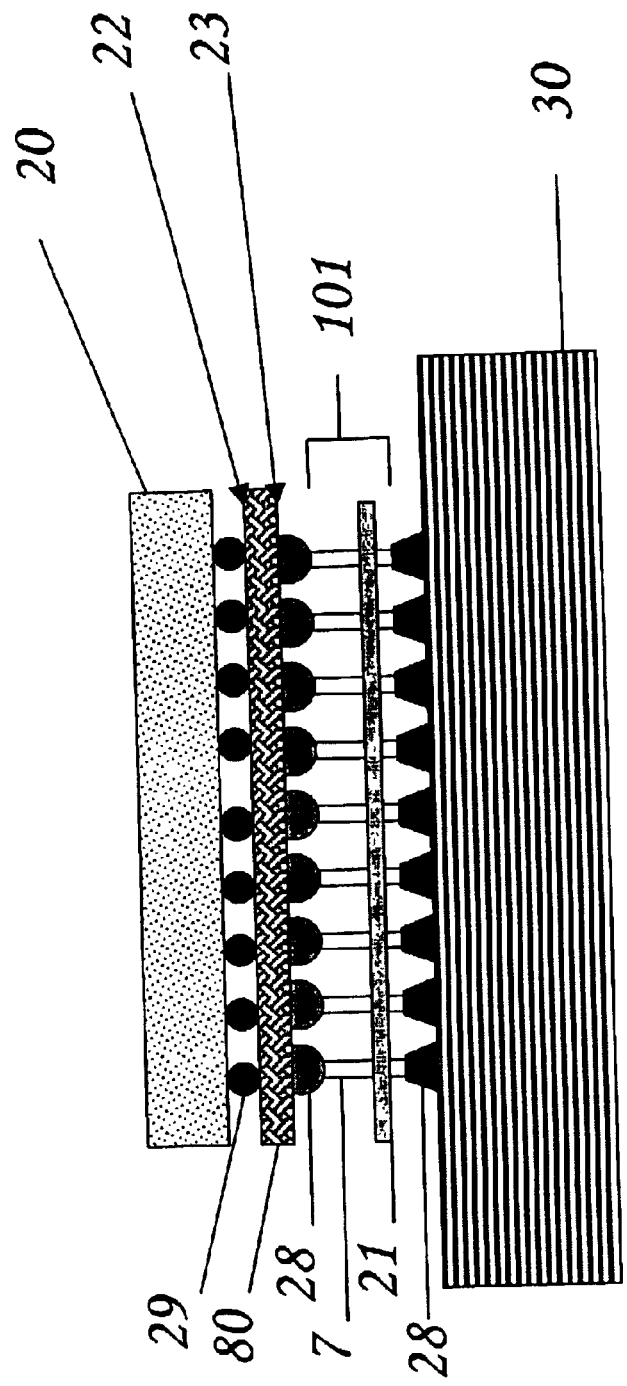
FIG. 14 shows the assembly of the PWB to the area grid array CSP with the interposer and compliant micro-lead matrix from FIG. 12.

FIG. 14 illustrates assembly of area grid array CSP 20 with area grid array interposer 80 and compliant micro-lead matrix 101 to PWB 30 at solder joints 28. This task is accomplished using surface mount assembly techniques known in the art and common to most assembly shops. Spacer 21 is shown but optional.

Whereas the present invention has been described with respect to specific embodiments thereof, it will be understood that various changes and modifications will be suggested to one skilled in the art and it is intended that the invention encompass such changes and modifications as fall within the scope of the appended claims.

What is claimed is:

1. A method of connecting an area grid array chip scale package (CSP) to a printed wiring board (PWB), comprising:

forming a lead matrix in a conductive material by etching the conductive material in a predetermined pattern to form a plurality of conductive leads substantially parallel to one another and substantially perpendicular to the CSP and the PWB, the leads being formed integrally with at least one tie bar, each lead having a body with first and second ends;

orienting a first side of the lead matrix so that the first ends of the leads are aligned with a reciprocal matrix of conductive surface pads on the area grid array CSP;

electrically connecting the conductive surface pads of the area grid array CSP to the respective first ends of the leads;

removing the tie bar from the lead matrix;

orienting a second side of the lead matrix so that the second ends of the leads are aligned with a reciprocal matrix of conductive surface pads of the PWB;

and electrically connecting the conductive surface pads of the PWB to the respective second ends of the leads thereby establishing an electrical connection between the area grid array CSP and the PWB, the lead bodies defining a space between the carrier and the chip or board to which the first ends of the leads are connected, the space containing the intermediate portion of the lead bodies.

2. A method of connecting an area grid array chip-scale package (CSP) to a printed wiring board (PWB), comprising:

forming a micro-lead matrix by etching a plurality of conductive leads in a conductive material, the leads having bodies with first and second ends with at least the second ends integrally formed with a tie bar of the conductive material;

providing an attachment tool having a matrix of holes formed therein, a first side and a second side;

mounting the lead bodies in the holes of the attachment tool so that respective first and second ends of each lead are exposed to the respective first and second sides of the attachment tool, the leads being aligned substantially in parallel with one another, with a longitudinal axis of the leads being substantially perpendicular to a plane defined by the attachment tool, each lead having an intermediate portion exposed to at least one side of the attachment tool and a first near the first side of the attachment tool and a second end near the second side of the attachment tool, the intermediate portion not being in alignment with the longitudinal axis;

applying a solder paste to a matrix of conductive pads of the area grid array CSP to form solder posts extending upward from each of the conductive surface pads of the area grid array CSP;

orienting the first ends of the leads on the first side of the attachment tooling of to align with the solder posts on the area grid array CSP so that the leads and the solder posts are arranged end to end;

applying a convection or vapor phase reflow process to area grid array CSP and micro-lead matrix thereby producing an electrical connection between the leads and the conductive surface pads of the area grid array CSP;

applying a solder paste to a matrix of conductive surface pads of the PWB to form solder posts extending upward from each of the conductive surface pads of the matrix of the PWB;

removing the tie bar of the conductive material from the second ends of the leads;

orienting the second ends of the leads to align with the solder posts on the PWB so that the leads and the solder posts are arranged end to end;

and applying a convection or vapor phase reflow process to PWB and micro-lead matrix to cause reflow of the solder posts on the PWB with the ends of the leads, thereby producing an electrical connection between the CSP and the PWB, the intermediate portions of the lead bodies being in a space between the CSP and the PWB to which the distal ends of the leads are connected.

3. The method of claim 2 and further comprising step of: after the step of applying a convection or vapor phase reflow process to PWB and micro-lead matrix, dissolving the attachment tool of the micro-lead matrix.

4. The method of claim 2 wherein the step of applying solder paste to the connecting surface of the area grid array CSP further comprises:

overlaying a stencil having a matrix of holes onto the area grid array CSP prior to applying solder paste to match the holes of the stencil with the connecting surface pads of the area grid array CSP;

and removing the stencil from the connecting surface of the area grid array CSP after applying the solder paste so that solder posts remain extending upward from the connecting surface pads of the area grid array CSP.

5. The method of claim 2 wherein the step of applying solder paste to the connecting surface of the PWB further comprises:

overlaying a stencil having a matrix of holes onto the PWB prior to applying solder paste to match the holes of the stencil with the connecting surface pads of the PWB;

and removing the stencil from the connecting surface of the PWB after applying the solder paste so that solder posts remain extending upward from the connecting surface pads of the PWB.

6. A method of connecting an area grid array chip-scale package (CSP) to an interposer and a printed wiring board (PWB) comprising:

providing a matrix of a plurality of conductive leads secured relative to one another in parallel, the leads being etched in a conductive material and having respective longitudinal axes substantially perpendicular to respective planes of the CSP, the interposer and the PWB, each lead having a body having first second ends formed integrally with a tie bar of the conductive material at the second ends;

orienting a first side of the lead matrix so that the first ends of the leads are aligned with a reciprocal matrix of conductive surface pads on the area grid array interposer;

electrically connecting the conductive surface pads of the area grid array interposer to the respective first ends of the leads;

removing the tie bar of conductive material;

orienting a second side of the lead matrix so that the second ends of the leads are aligned with a reciprocal matrix of conductive surface pads of the PWB;

electrically connecting the conductive surface pads of the PWB to the respective second ends of the lead matrix, thereby establishing an electrical connection between the area grid array interposer and the PWB, the lead bodies defining a space between the carrier and the chip or board to which the first ends of the leads are connected, the space containing the intermediate portion of the lead bodies;

and electrically connecting the area grid array interposer to the area grid array CSP, thereby establishing an electrical connection between the area grid array CSP and the PWB.

7. A method of connecting an area grid array chip-scale package (CSP) to a printed wiring board (PWB), comprising:

providing a micro-lead matrix including plurality of conductive leads, the leads having bodies with first and second ends formed by etching a conductive material, the second ends being formed integrally with a tie bar of the conductive material;

providing an attachment tool having a matrix of holes formed therein and first and second sides;

mounting bodies in the holes of the attachment tool so that respective first and second ends of each lead are exposed at the respective first and second sides of the attachment tool, the leads being aligned substantially in parallel with one another, with respective longitudinal axes of the leads being substantially perpendicular to a plane defined by the attachment tool, each lead having an intermediate portion exposed to at least one side of the attachment tool and a first end which is distal from the carrier, the intermediate portion not being in alignment with the longitudinal axis;

applying a solder paste to a matrix of conductive surface pads of the area grid array interposer to form solder posts extending upward from each of the conductive surface pads of the area grid array interposer;

orienting the first ends of the leads on the first side of the attachment tool to align with the solder posts on the area grid array interposer so that the leads and the solder posts are arranged end to end;

applying a convection or vapor phase reflow process to area grid array interposer and micro-lead matrix thereby producing an electrical connection between the leads and the conductive surface pads of the area grid array interposer;

applying a solder paste to a matrix of conductive surface pads of the PWB to form solder posts extending upward from each of the conductive surface pads of the matrix of the PWB;

removing the tie bar of the conductive material;

orienting the second ends of the leads on the second side of the attachment tool to align with the solder posts on the PWB so that the leads and the solder posts are arranged end to end;

and applying a convection or vapor phase reflow process to the PWB and micro-lead matrix to cause reflow of the solder posts on the PWB with the ends of the leads on the second side of the lead matrix thereby producing an electrical connection between the interposer and the PWB, the intermediate portions of the lead bodies being in a space between the interposer and the PWB to which the distal ends of the leads are connected.

8. The method of claim 7 and further comprising step of:

after the step of applying a convection or vapor phase reflow process to PWB and micro-lead matrix, dissolving the attachment tool of the micro-lead matrix second applying step, dissolving the attachment tool of the micro-lead matrix.

9. The method of claim 7 wherein the step of applying solder paste to the connecting surface of the area grid array interposer further comprises:

overlaying a stencil having a matrix of holes onto the area grid array interposer prior to applying solder paste to match the holes of the stencil with the connecting surface pads of the area grid array interposer;

and removing the stencil from the connecting surface of the area grid array interposer after applying the solder paste so that solder posts remain extending upward from the connecting surface pads of the area grid array interposer.

10. The method of claim 7 wherein the step of applying solder paste to the connecting surface of the PWB further comprises:

overlaying a stencil having a matrix of holes onto the PWB prior to applying solder paste to match the holes of the stencil with the connecting surface pads of the PWB;

and removing the stencil from the connecting surface of the PWB after applying the solder paste so that solder posts remain extending upward from the connecting surface pads of the PWB.

11. The method of claim 7 wherein the step of applying solder paste to the connecting surface of the interposer further comprises:

overlaying a stencil having a matrix of holes onto the interposer prior to applying solder paste to match the holes of the stencil with the connecting surface pads of the interposer;

and removing the stencil from the connecting surface of the interposer after applying the solder paste so that solder posts remain extending upward from the connecting surface pads of the interposer.

* * * * *